(12) United States Patent
Saito et al.

(10) Patent No.: US 11,171,079 B2
(45) Date of Patent: Nov. 9, 2021

(54) SEMICONDUCTOR DEVICE AND METHOD OF MANUFACTURING SEMICONDUCTOR DEVICE

(71) Applicant: Toshiba Memory Corporation, Tokyo (JP)

(72) Inventors: Shinji Saito, Yokohama Kanagawa (JP); Yoshitaka Ono, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 250 days.

(21) Appl. No.: 16/284,057

(22) Filed: Feb. 25, 2019

(65) Prior Publication Data

US 2020/0091052 A1   Mar. 19, 2020

(30) Foreign Application Priority Data

Sep. 14, 2018   (JP) .............................. JP2018-173106

(51) Int. Cl.
*H01L 23/498*   (2006.01)
*H01L 23/00*   (2006.01)
*H01L 23/13*   (2006.01)

(52) U.S. Cl.
CPC ........ *H01L 23/49816* (2013.01); *H01L 23/13* (2013.01); *H01L 23/49822* (2013.01); *H01L 24/05* (2013.01)

(58) Field of Classification Search
CPC ........... H01L 23/3128; H01L 23/49816; H01L 23/49827; H01L 23/49838; H01L 24/45; H01L 24/48; H01L 24/85; H01L 2224/48227; H01L 2224/48235; H01L 2224/73265; H01L 2924/15311
See application file for complete search history.

(56) References Cited

U.S. PATENT DOCUMENTS

| 4,733,289 A | 3/1988 | Tsurumaru | |
|---|---|---|---|
| 6,300,685 B1 | 10/2001 | Hasegawa et al. | |
| 2004/0207080 A1* | 10/2004 | Nakano ................. | H01L 23/562 257/734 |
| 2005/0093179 A1 | 5/2005 | Andoh | |
| 2006/0091523 A1* | 5/2006 | Shimanuki .............. | H01L 24/97 257/698 |
| 2009/0127690 A1* | 5/2009 | Jaducana ............ | H01L 31/0203 257/690 |

(Continued)

FOREIGN PATENT DOCUMENTS

| JP | 2002-093950 A | 3/2002 |
|---|---|---|
| JP | 2005-136329 A | 5/2005 |

(Continued)

*Primary Examiner* — David C Spalla
(74) *Attorney, Agent, or Firm* — Kim & Stewart LLP

(57) ABSTRACT

A semiconductor device includes a substrate including wiring at a surface thereof, a semiconductor element on a surface of the substrate, a first solder resist on the wiring, a bonding wire connecting the wiring and the semiconductor element, and a second solder resist. The first solder resist has an opening region at which a part of the wiring is non-covered by the first solder resist, and the bonding wire connects the wiring and the semiconductor element in the opening region. The second solder resist at least partially covers the non-covered part of the wiring in the opening region.

19 Claims, 3 Drawing Sheets

(56) References Cited

U.S. PATENT DOCUMENTS

2013/0020685 A1\* 1/2013 Kwak .................. H01L 23/552
　　　　　　　　　　　　　　　　　　　　　　257/659

FOREIGN PATENT DOCUMENTS

| JP | 2009-283873 A | 12/2009 |
| JP | 2011-211114 A | 10/2011 |
| TW | 200629509 A | 8/2006 |
| TW | 201613004 A | 4/2016 |
| WO | 2018116785 A1 | 6/2018 |

\* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2018-173106, filed Sep. 14, 2018, the entire contents of which are incorporated herein by reference.

FIELD

Embodiments described herein relate generally to a semiconductor device and a method of manufacturing a semiconductor device.

BACKGROUND

In the related art, in a semiconductor package such as a Ball Grid Array (BGA), it is known that a wire bonding portion of a substrate on which a semiconductor element is mounted is configured such that thermal stress concentrates at a region where different materials such as wiring, solder resist, bonding wire, and resin intersect. It is known from an evaluation analysis that reliability of a Temperature Cycle Test (TCT) tends to deteriorate as a thickness of a resin-sealed semiconductor device and a total silicon thickness increase. The reason for this issue is believed be caused by disconnection of the wiring.

DETAILED DESCRIPTION

Embodiments provide a semiconductor device having high reliability, and a method of manufacturing a semiconductor device.

In general, according to an embodiment, a semiconductor device includes a substrate including wiring at a surface thereof, a semiconductor element on a surface of the substrate, a first solder resist on the wiring, a bonding wire connecting the wiring and the semiconductor element, and a second solder resist. The first solder resist has an opening region at which a part of the wiring is non-covered by the first solder resist, and the bonding wire connects the wiring and the semiconductor element in the opening region. The second solder resist at least partially covers the non-covered part of the wiring in the opening region.

Hereinafter, in embodiments, an internal structure of a semiconductor device that is a semiconductor package will be described.

First Embodiment

Figure 1:
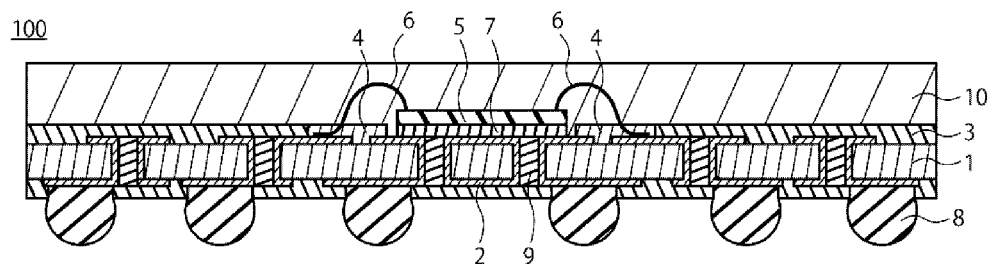
FIG. 1 illustrates a cross-sectional view of an example of a semiconductor device according to a first embodiment.
Figure 2:
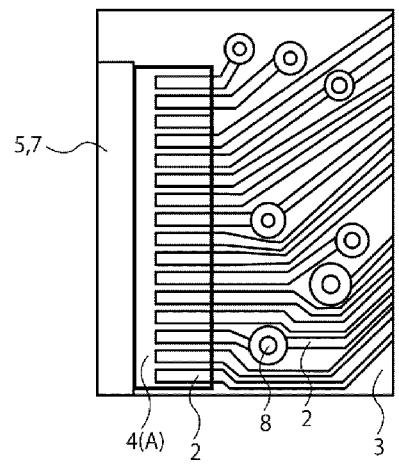
FIG. 2 illustrates a plan view of the semiconductor device according to the first embodiment.

FIG. 1 illustrates a cross-sectional view of an example of a semiconductor device according to a first embodiment. FIG. 2 illustrates a plan view of the semiconductor device according to the first embodiment. In FIGS. 1 and 2, a semiconductor device 100 according to the first embodiment includes a substrate 1 in which wiring 2 is disposed, a semiconductor element 5 disposed on the substrate 1, a first solder resist 3 which is disposed on the wiring 2 and has an opening region A, and where a part of the wiring 2 faces the opening region A, a bonding wire 6 that connects the wiring 2 and the semiconductor element 5 in the opening region A, a second solder resist 4 that covers the wiring 2 facing the opening region A, and an insulating resin 10. Die bonding 7 is disposed between the semiconductor element 5 and the substrate 1. A plurality of solder balls 8 are disposed on a surface on a side opposite to a semiconductor element 5 side of the substrate 1. An insulating film 9 is disposed in a through-hole of the substrate 1. A surface on the semiconductor element 5 side of the substrate 1 is sealed with the insulating resin 10. A semiconductor device of a ball grid array (BGA) type is illustrated in FIG. 1.

The substrate 1 is a wiring substrate in which the wiring formed of a material such as Cu is disposed. The semiconductor element 5 is disposed in the substrate 1. The semiconductor element 5 is disposed on one surface of the substrate 1 and the solder ball 8 that is an external terminal of the semiconductor device 100 is disposed on the other surface on a side opposite to the one side. The wiring 2 electrically connects the semiconductor element 5 and the solder ball 8. The substrate 1 includes a through-hole penetrating the substrate 1, the wiring 2 and the insulating film 9 are disposed in the through-hole, and a front and a back of the substrate 1 are electrically connected by the wiring 2. The substrate 1 is not particularly limited, such as a glass substrate or a ceramic substrate.

The first solder resist 3 is an insulating film disposed on the substrate 1 and the wiring 2. The first solder resist 3 has the opening region A. A part of the wiring 2 faces the opening region A, and the wiring 2 and the semiconductor element 5 are connected by the bonding wire 6 such as an Au wire in the opening region A. The wiring 2 facing the opening region A is a portion which is a so-called bonding pad where no solder resist is provided. The first solder resist 3 includes a thermosetting resin or a photo-setting resin. It is preferable that the first solder resist 3 is made of a material not containing a filler.

The second solder resist 4 is an insulating film disposed on the substrate 1 and the wiring 2. FIG. 2 is a top view in which the bonding wire 6 and the insulating resin 10 are omitted. The opening region A is a region surrounded by a thick line and is a region close to the semiconductor element, which is a main heat source of the semiconductor device 100. The second solder resist 4 covers the wiring 2 facing the opening region A. The second solder resist 4 is disposed at a position where a sealant (insulating resin 10 in the present application) is disposed in the semiconductor device of the related art. The second solder resist 4 includes a thermosetting resin or a photo-setting resin. It is preferable that the second solder resist 4 is made of a material not containing a filler.

In FIG. 1, the second solder resist 4 is disposed so as to be separated from the semiconductor element 5. That is, a gap is provided between the semiconductor element 5 and the second solder resist 4. Moreover, the insulating resin 10 is disposed in the gap between the semiconductor element 5 and the second solder resist 4. In addition, in FIG. 1, the second solder resist 4 is in direct contact with the substrate 1. In addition, in FIG. 1, the second solder resist 4 is in direct contact with the wiring 2. In addition, in FIG. 1, the second solder resist 4 is in direct contact with the first solder resist 3. In addition, in FIG. 1, the second solder resist 4 is in direct contact with the bonding wire 6. In addition, in FIG. 1, the second solder resist 4 is in direct contact with the insulating resin 10.

In FIG. 1, the first solder resist 3 and the second solder resist 4 are configured to have the same height. In addition, in FIG. 1, the bonding wire 6 penetrates the second solder resist 4. In FIG. 1, the second solder resist 4 entirely covers the bonding wire 6, and the second solder resist 4 is formed such that the second solder resist 4 and the bonding wire 6 can be in non-contact except for a connecting portion with the wiring 2.

Most of the wiring 2 including the opening region A and disposed on a surface of the substrate 1 on a side where the semiconductor element 5 is formed is covered by the solder resist by providing the second solder resist 4. In the wiring 2 disposed on the surface of the substrate 1 on the side where the semiconductor element 5 is formed, three types of materials of the wiring 2, the second solder resist 4, and the bonding wire 6 are mixed at a portion connected to the bonding wire 6. In the wiring 2 connected to the portion facing the opening region A, the first solder resist 3 covers the wiring 2.

In the related art, in the wiring 2 disposed on the surface of the substrate 1 on the side where the semiconductor element 5 is formed, three types of materials of the wiring 2, not the second solder resist 4 but the sealant, and the bonding wire 6 are mixed at a portion connected to the bonding wire 6. Since the opening region A is a region adjacent to the semiconductor element 5 that emits heat, the opening region A is a region where heat stress is likely to be applied. In the semiconductor device of the related art, the wiring 2 covered by the first solder resist 3 in the vicinity of the opening region A is likely to be disconnected. That is, a portion between a portion of the wiring 2 facing the opening region A and a portion of the wiring 2 not facing the opening region A is likely to be disconnected.

A difference between the portion of the wiring 2 facing the opening region A and the portion of the wiring 2 not facing the opening region A is presence or absence of the bonding wire 6 and the sealant. Different materials have different thermal expansion coefficients. If hardness of the material and the like are different, an influence of the thermal expansion increases. Therefore, in order to alleviate the thermal and/or mechanical stress between the portion of the wiring 2 facing the opening region A and the portion of the wiring 2 not facing the opening region A, the wiring 2 facing the opening region A is covered by the second solder resist 4 which is the same solder resist as the first solder resist 3, and thereby these stresses are alleviated, and the reliability of the wiring 2 is improved.

That is, in the embodiment, three types of the wiring 2, the second solder resist 4, and the bonding wire 6 are mixed in the opening region A. In addition, in the embodiment, two types of the wiring 2 and the first solder resist 3 are mixed in a region adjacent to the opening region A. The wiring 2 and the solder resist are common in the opening region A and the region adjacent to the opening region A. The disconnection of the wiring 2 adjacent to the opening region A can be prevented by arranging the configurations in the opening region A and the region adjacent to the opening region A to be close to each other, and the reliability of the semiconductor device 100 can be improved.

Since the bonding wire 6 is provided in the opening region A but the wiring 2 is covered by the same or similar solder resist in the opening region A and outside the opening region A, the opening region A and outside the opening region A have similar field, so that it is considered that the disconnection of the wiring 2 can be prevented. From the viewpoint of improving the reliability of the wiring 2, it is preferable that a thermal expansion coefficient ($\beta1(/K)$) of the first solder resist 3 and the thermal expansion coefficient ($\beta2(/K)$) of the second solder resist 4 are substantially the same. The expression "substantially the same" means that a difference $2\times|\beta1-\beta2|/(\beta1+\beta2)$) between the thermal expansion coefficient ($\beta1(/K)$) of the first solder resist 3 and the thermal expansion coefficient ($\beta2(/K)$) of the second solder resist 4 is within 5.0%. From the viewpoint of improving the reliability of the wiring 2, it is further preferable that the difference between the thermal expansion coefficient ($\beta1(/K)$) of the first solder resist 3 and the thermal expansion coefficient ($\beta2(/K)$) of the second solder resist 4 is within 3.0%.

If the first solder resist 3 and the second solder resist 4 are the same solder resist, the reliability of the wiring 2 is further improved, which is preferable.

From the viewpoint of improving the reliability of the wiring 2, it is preferable that the entire surface of the wiring 2 facing the opening region A is covered by the bonding wire 6 and the second solder resist 4. That is, it is preferable that the entire surface of the surface of the wiring 2 facing the opening region A except for a portion connected to the bonding wire 6 is covered by the second solder resist 4. Furthermore, it is further preferable that the opening region A is filled with the second solder resist 4. When 60 vol % or more of the opening region A is filled with the second solder resist 4, the thermal and mechanical, or thermal and mechanical stress is further alleviated. From the same viewpoint, it is further preferable that 80 vol % or more of the opening region A is filled with the second solder resist 4, and it is still further preferable that 100 vol % of the opening region A is filled with the second solder resist 4.

The semiconductor element 5 is disposed on the substrate 1. The semiconductor element 5 includes, for example, an arithmetic element and a memory element. A semiconductor device using the arithmetic element for the semiconductor element 5 is not particularly limited, for example, a Central Processing Unit (CPU), a Programmable Logic Device (PLD), a Graphic Processing Unit (GPU), an Application Specific Integration Circuit (ASIC), a Digital Signal Processor (DSP), or the like. A semiconductor device using the memory element in the semiconductor element 5 is not particularly limited, such as a Dynamic Random Access Memory (DRAM), a Resistive Random Access Memory (ReRAM), a Phase Change Memory (PCRAM), a NAND, or the like. The semiconductor element 5 is electrically connected to the solder ball 8 on the rear surface of the substrate 1 via the bonding wire 6 and the wiring 2. The semiconductor element 5 is disposed in the die bonding 7 on the substrate 1.

The insulating resin 10 is insulating sealant. The insulating resin 10 is disposed on the semiconductor element 5, the first solder resist 3, and the second solder resist 4. The insulating resin 10 seals the substrate 1 on which the semiconductor element 5 and the wiring 2 are provided. More specifically, the insulating resin 10 entirety covers the substrate 1 and the semiconductor element 5 so that the solder balls 8 are exposed. The insulating resin 10 includes a filler in order to mechanically protect the semiconductor device 100. In the present application, when a filler having an average particle diameter of 10 µm or less is included, it is handled as not containing the filler. It is preferable that the insulating resin 10 contains a filler having an average particle diameter of 20 µm or more.

Next, a method of manufacturing the semiconductor device 100 will be described.

The method of manufacturing the semiconductor device 100 includes a step (first step) of connecting the wiring 2 and the semiconductor element 5 by the bonding wire 6 in the opening region A of the first solder resist 3 which is disposed on the substrate 1 in which the wiring 2 and the semiconductor element 5 are disposed and has the opening region A, and where a part of the wiring 2 faces the opening region A; and a step (second step) of covering the wiring 2 of a portion which is not connected by the bonding wire 6 by the second solder resist 4 in the opening region A.

Figure 3:
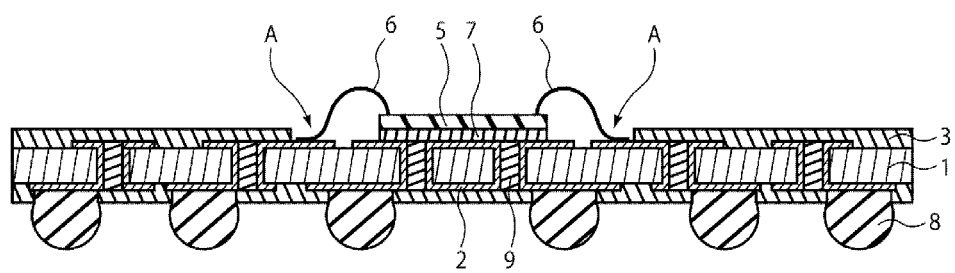
FIGS. 3 and 4 illustrate a cross-sectional view of a semiconductor device to explain a manufacturing process according to the first embodiment.
Figure 4:
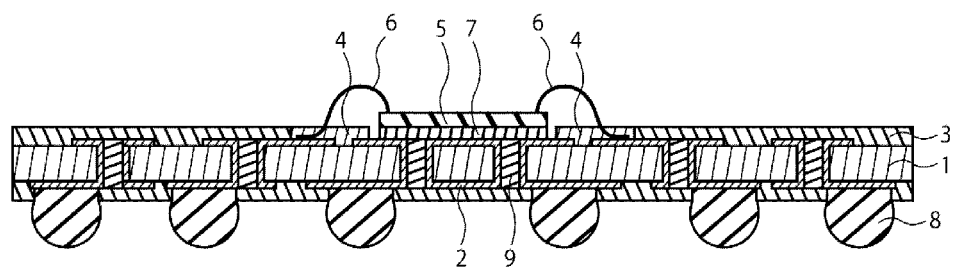

FIGS. 3 and 4 illustrate cross-sectional views of the semiconductor device 100 to explain the manufacturing process. FIG. 3 illustrates a cross-sectional view to explain the step (first step) of connecting the wiring 2 and the semiconductor element 5 by the bonding wire 6 in the opening region A of the first solder resist 3 which is disposed on the substrate 1 in which the wiring 2 and the semiconductor element 5 are disposed and has the opening region A, and where a part of the wiring 2 faces the opening region A. In a member on which the second solder resist 4 is not formed, the bonding wire 6 is formed to connect the wiring 2 facing the opening region A and the semiconductor element 5.

Next, the second solder resist 4 is formed in the member illustrated in FIG. 3. FIG. 4 illustrates a cross-sectional view to explain the step (second step) of covering the wiring 2 of a portion which is not connected by the bonding wire 6 by the second solder resist 4 in the opening region A. A precursor of the second solder resist 4 is applied to the opening region A and irradiated with, for example, ultraviolet rays to cure the precursor (including the photo-setting resin) of the second solder resist 4. In addition, the precursor (including the thermosetting resin) of the second solder resist 4 may be cured by heat. The method of applying the precursor of the second solder resist 4 is not particularly limited to a dispenser, inkjet or spin coating. After curing, exposure and development may be carried out to control a forming position of the second solder resist 4 or the like. When the precursor of the second solder resist 4 is applied by the inkjet, the forming position of the second solder resist 4 may be controlled without performing exposure and development.

Disconnection of the wiring 2 can be prevented and the semiconductor device 100 having improved reliability can be obtained by a simple step by adopting the manufacturing method.

Second Embodiment

Figure 5:
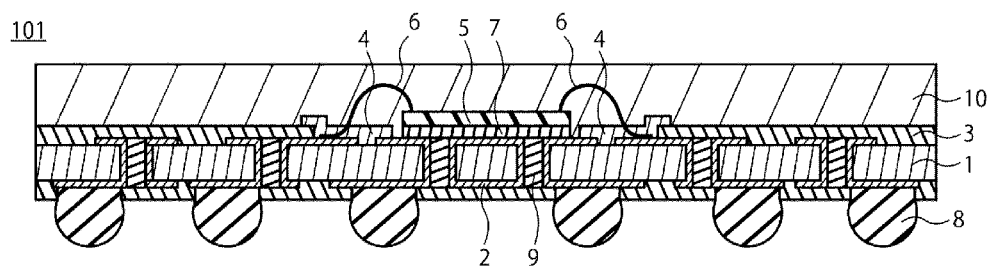
FIG. 5 illustrates a cross-sectional view of an example of a semiconductor device according to a second embodiment.

A second embodiment is a modification example of the first embodiment. FIG. 5 illustrates a cross-sectional view of an example of a semiconductor device according to the second embodiment. In a semiconductor device 101 illustrated in FIG. 5, a part of a first solder resist 3 and a part of a second solder resist 4 are stacked. Wiring 2 in the vicinity of an opening region A outside the opening region A is likely to be disconnected, so that it is preferable that apart of the first solder resist 3 and a part of the second solder resist 4 are stacked at a position where a side surface of the first solder resist 3 in the vicinity of the opening region A is in contact with a side surface of the second solder resist 4. If the second solder resist 4 is formed so that a part of the first solder resist 3 and a part of the second solder resist 4 are stacked, a gap between the first solder resist 3 and the second solder resist 4 due to a manufacturing error is prevented from occurring. If there is a gap between the first solder resist 3 and the second solder resist 4, it is not preferable that since the wiring 2 is likely to be disconnected in the vicinity of the gap.

Third Embodiment

Figure 6:
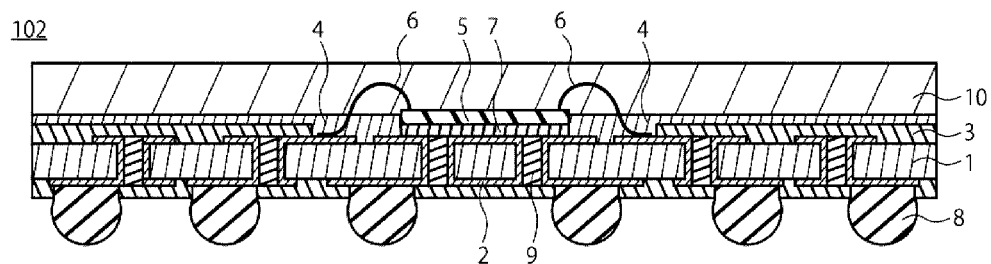
FIG. 6 illustrates a cross-sectional view of an example of a semiconductor device according to a third embodiment.

A third embodiment is a modification example of the first embodiment. FIG. 6 illustrates a cross-sectional view of an example of a semiconductor device according to a third embodiment. In a semiconductor device 102 illustrated in FIG. 6, a first solder resist 3 is covered by a second solder resist 4. In such a structure, similar to the semiconductor device 101 of the second embodiment, a gap between the first solder resist 3 and the second solder resist 4 is unlikely to be generated. In addition, in the semiconductor device 102, the second solder resist 4 is entirety formed on a substrate 1 on which wiring 2 is disposed except for a portion where a semiconductor element 5 is disposed. The reliability of the second solder resist 4 is improved and a forming step can be simplified compared to a case where the second solder resist 4 is partially formed.

Fourth Embodiment

Figure 7:
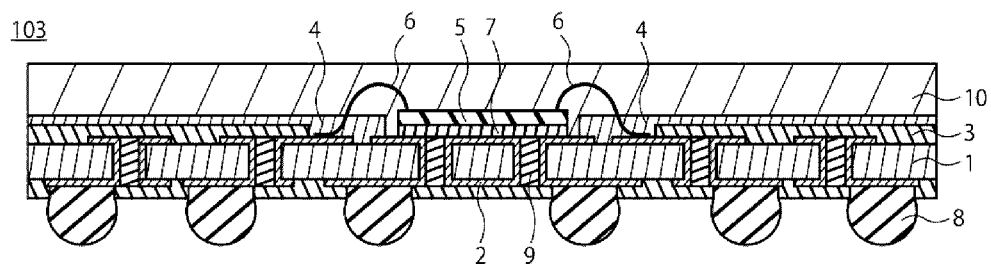
FIG. 7 illustrates a cross-sectional view of an example of a semiconductor device according to a fourth embodiment.

A fourth embodiment is a modification example of the third embodiment. FIG. 7 illustrates a cross-sectional view of an example of a semiconductor device according to a fourth embodiment. In a semiconductor device 103 illustrated in FIG. 7, there is a gap between a semiconductor element 5 and a second solder resist 4. In the semiconductor device 102, the semiconductor element 5 has both surfaces of a surface being in contact with the second solder resist 4 and a surface being in contact with the insulating resin 10. Due to a difference in physical properties between the second solder resist 4 and the insulating resin 10, thermal and/or mechanical influence on the semiconductor element 5 differ depending on places. On the other hand, in the semiconductor device 103, the semiconductor element 5 is covered by the insulating resin 10 except for a die bonding 7, which is preferable from the above-described viewpoint.

Fifth Embodiment

Figure 8:
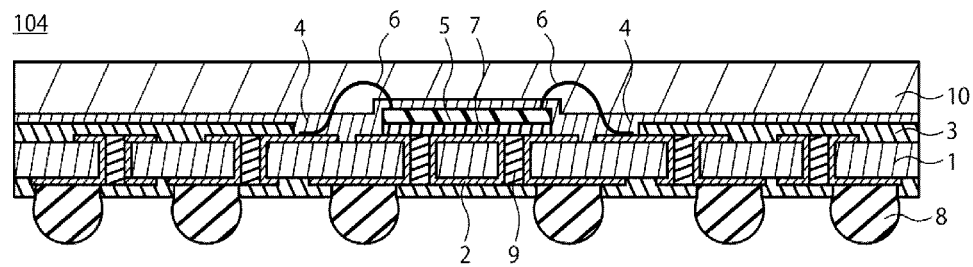
FIG. 8 illustrates a cross-sectional view of an example of a semiconductor device according to a fifth embodiment.

A fifth embodiment is a modification example of the third embodiment. FIG. 8 illustrates a cross-sectional view of an example of a semiconductor device according to the fifth embodiment. In a semiconductor device 104 illustrated in FIG. 8, a semiconductor element 5 is covered by a second solder resist 4 except for a die bonding 7. Such a structure is preferable from the above-described viewpoint.

Sixth Embodiment

Figure 9:
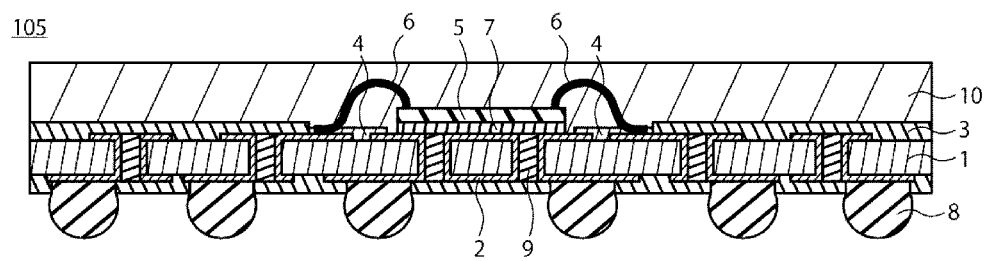
FIG. 9 illustrates a cross-sectional view of an example of a semiconductor device according to a sixth embodiment.

A sixth embodiment is a modification example of the first embodiment. FIG. 9 illustrates a cross-sectional view of an example of a semiconductor device according to the sixth embodiment. In a semiconductor device 105 illustrated in FIG. 9, a diameter of a bonding wire 6 is larger than a thickness of a second solder resist 4. Even if the thickness of the second solder resist 4 is relatively small, the semiconductor device 105 of the embodiment is improved in reliability.

Seventh Embodiment

Figure 10:
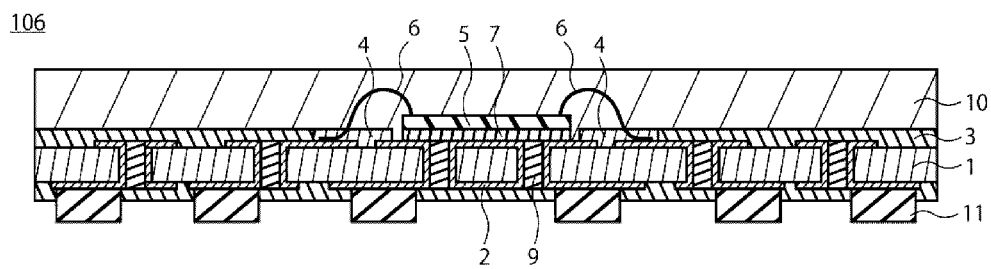
FIG. 10 illustrates a cross-sectional view of an example of a semiconductor device according to a seventh embodiment.

A seventh embodiment is a modification example of the first embodiment. FIG. 10 illustrates a cross-sectional view of an example of a semiconductor device according to the seventh embodiment. In a semiconductor device 106 illustrated in FIG. 10, the solder balls 8 is replaced with lands 11. The semiconductor device 106 is a land grid array (LGA) type and a configuration of the embodiment also improves reliability in the semiconductor device 106 of the LGA type.

Eighth Embodiment

Figure 11:
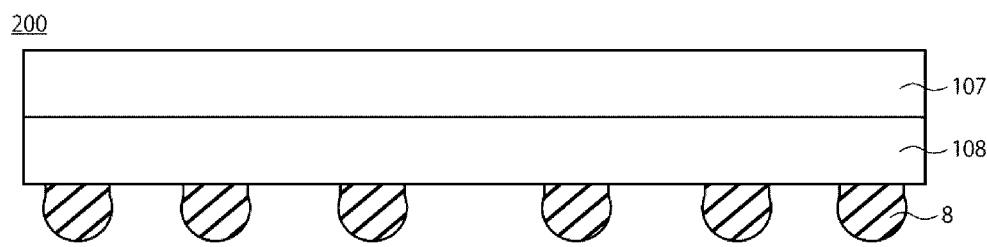
FIG. 11 illustrates a cross-sectional view of an example of a semiconductor device according to an eighth embodiment.

An eighth embodiment is a modification example of the first embodiment. FIG. 11 illustrates a cross-sectional view of an example of a semiconductor device according to the eighth embodiment. In a semiconductor device 200 illustrated in FIG. 11, a semiconductor device 107 and a semiconductor device 108 are stacked. Also in the stack type, disconnection of a wiring 2 can be prevented and the reliability of the semiconductor device 200 can be improved.

In addition, all the semiconductor devices including the elements of the present disclosure, which can be appropriately designed and changed by those skilled in the art, are included in the scope of the present disclosure.

For the sake of simplicity of explanation, a method commonly used in the semiconductor industry, for example, a photolithography process, cleaning before and after treatment, or the like is omitted, but it is needless to say that these methods can be included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate including wiring at a surface thereof;
a semiconductor element on a surface of the substrate;
a first solder resist on the wiring, the first solder resist having an opening region at which a part of the wiring is non-covered by the first solder resist;
a bonding wire connecting the wiring and the semiconductor element in the opening region; and
a second solder resist at least partially covering the non-covered part of the wiring in the opening region, wherein a thickness of the second solder resist is less than a width of the bonding wire at a connection region at which the bonding wire is connected to the wiring of the substrate.

2. The semiconductor device according to claim 1, wherein a thermal expansion coefficient of the first solder resist and a thermal expansion coefficient of the second solder resist are substantially the same.

3. The semiconductor device according to claim 1, wherein a thermal expansion coefficient $\beta 1$ of the first solder resist and a thermal expansion coefficient $\beta 2$ of the second solder resist satisfy $2|\beta 1-\beta 2|/(\beta 1+\beta 2) \leq 0.05$.

4. The semiconductor device according to claim 1, wherein a thermal expansion coefficient $\beta 1$ of the first solder resist and a thermal expansion coefficient $\beta 2$ of the second solder resist satisfy $2|\beta 1-\beta 2|/(\beta 1+\beta 2) \leq 0.03$.

5. The semiconductor device according to claim 1, wherein the second solder resist entirely covers the non-covered part of the wiring in the opening region.

6. The semiconductor device according to claim 1, wherein the second solder resist at least covers a region of the non-covered part of the wiring at which the bonding wire is connected.

7. The semiconductor device according to claim 1, further comprising:
an insulating resin layer on the semiconductor element, the first solder resist, and the second solder resist, the insulating resin layer containing a filler.

8. The semiconductor device according to claim 1, wherein a part of the first solder resist and a part of the second solder resist are overlaid.

9. The semiconductor device according to claim 1, wherein the second solder resist covers the first solder resist.

10. The semiconductor device according to claim 1, wherein the second solder resist fills the opening region.

11. The semiconductor device according to claim 1, wherein a gap is provided between the semiconductor element and the second solder resist.

12. The semiconductor device according to claim 1, wherein the second solder resist covers the semiconductor element.

13. The semiconductor device according to claim 1, wherein the semiconductor device is of a ball grid array (BGA) type.

14. The semiconductor device according to claim 1, wherein the semiconductor device is of a land grid array (LGA) type.

15. A method of manufacturing a semiconductor device comprising:
preparing a device including a substrate including wiring at a surface thereof, a semiconductor element on a surface of the substrate, and a first solder resist on the wiring, the first solder resist having an opening region at which a part of the wiring is exposed;
connecting the wiring and the semiconductor element with a bonding wire in the opening region of the first solder resist; and
at least partially covering the exposed part of the wiring in the opening region with a second solder resist, wherein a thermal expansion coefficient $\beta 1$ of the first solder resist and a thermal expansion coefficient $\beta 2$ of the second solder resist satisfy $2|\beta 1-\beta 2|/(\beta 1+\beta 2) \leq 0.05$.

16. The method according to claim 15, wherein a thermal expansion coefficient of the first solder resist and a thermal expansion coefficient of the second solder resist are substantially the same.

17. The method according to claim 15, further comprising:
covering the semiconductor element, the first solder resist, and the second solder resist with an insulating resin layer containing a filler.

18. A semiconductor device comprising:
a substrate including wiring at a surface thereof;

a semiconductor element on a surface of the substrate;
a first solder resist on the wiring, the first solder resist having an opening region at which a part of the wiring is non-covered by the first solder resist;
a bonding wire connecting the wiring and the semiconductor element in the opening region; and
a second solder resist at least partially covering the non-covered part of the wiring in the opening region,
wherein a gap is provided between the semiconductor element and the second solder resist, and the second solder resist is not formed under the semiconductor element.

19. The semiconductor device according to claim 18, wherein a maximum height of the second solder resist is lower than a maximum height of the semiconductor element.

\* \* \* \* \*